(12) United States Patent
Matsuda

(10) Patent No.: US 12,034,418 B2
(45) Date of Patent: Jul. 9, 2024

(54) DIFFERENTIAL AMPLIFIER CIRCUIT FOR USE IN ERROR AMPLIFIER OR COMPARATOR BEING COMPONENT OF DC TO DC CONVERTER (AS AMENDED)

(71) Applicant: Nisshinbo Micro Devices Inc., Tokyo (JP)

(72) Inventor: Tomoaki Matsuda, Takarazuka (JP)

(73) Assignee: NISSHINBO MICRO DEVICES INC., Tokyo (JP)

( * ) Notice: Subject to any disclaimer, the term of this patent is extended or adjusted under 35 U.S.C. 154(b) by 461 days.

(21) Appl. No.: 17/596,273

(22) PCT Filed: Jul. 26, 2021

(86) PCT No.: PCT/JP2021/027588

§ 371 (c)(1),
(2) Date: Dec. 7, 2021

(87) PCT Pub. No.: WO2023/007556
PCT Pub. Date: Feb. 2, 2023

(65) Prior Publication Data
US 2023/0022362 A1      Jan. 26, 2023

(51) Int. Cl.
*H03F 3/45*   (2006.01)
*G05F 1/46*   (2006.01)
*H02M 3/155*  (2006.01)
*H03F 3/30*   (2006.01)

(52) U.S. Cl.
CPC ........... *H03F 3/45269* (2013.01); *G05F 1/46* (2013.01); *H02M 3/155* (2013.01)

(58) Field of Classification Search
CPC ............. H03F 3/45269; H03F 3/45183; H03F 2203/45674; G05F 1/46; H02M 3/155

USPC ......................................... 330/252–261, 283
See application file for complete search history.

(56) References Cited

U.S. PATENT DOCUMENTS 10,283,506 B2 *   5/2019   Schober ........... H01L 21/823814
10,566,941 B2 *   2/2020   Nomura ........... H01L 21/823412

FOREIGN PATENT DOCUMENTS

| JP | 56-37716   | 4/1981 |
| JP | 7-44393    | 5/1995 |
| JP | 2002-108465| 4/2002 |
| JP | 2011-35845 | 2/2011 |

OTHER PUBLICATIONS

Feb. 8, 2024 Notification Of Transmittal Of Translation of the International Preliminary Report on Patentability in connection with PCT/JP2021/027588.

* cited by examiner

*Primary Examiner* — Hieu P Nguyen
(74) *Attorney, Agent, or Firm* — Paul Teng

(57) ABSTRACT

A differential amplifier circuit of the present invention includes a differential input circuit including first and second transistors, and amplifies a difference voltage between a first input voltage applied to a control terminal of the first transistor and a second input voltage applied to a control terminal of the second transistor. The differential input circuit a P-channel depletion type transistor having a gate connected to the control terminal of the first transistor and a source connected to the control terminal of the second transistor, and the P-channel depletion type transistor operates as a bias current source of the differential amplifier circuit.

5 Claims, 3 Drawing Sheets

DIFFERENTIAL AMPLIFIER CIRCUIT FOR USE IN ERROR AMPLIFIER OR COMPARATOR BEING COMPONENT OF DC TO DC CONVERTER (AS AMENDED)

TECHNICAL FIELD

The present invention relates to a differential amplifier circuit for use in an error amplifier or a comparator that is a component of a DC to DC converter, for example.

BACKGROUND ART

In recent years, there has been a need to reduce the consumption of DC to DC converters. As a technique for reducing the consumption of error amplifiers or comparators, which are components of DC to DC converters, it is possible to reduce the current consumption by limiting the bias current supplied to the error amplifier or comparator when the load of the DC to DC converter is small, and to reduce the current consumption by limiting the bias current supplied to the error amplifier or comparator when the load of the DC to DC converter is large. The technology to enable high-speed operation by increasing the bias current supplied to the error amplifier or comparator when the load is large is already known.

For example, in Patent Document 1, in order to provide a differential amplifier that optimizes the current supply capability according to the potential difference between the input differential signals, the differential amplifier includes a differential amplifier having a current drive capability according to the potential difference between the input voltages, an adjustment unit that outputs an adjustment signal having a voltage amplitude according to the potential difference between the input voltages. The differential amplifier further includes a current source that adjusts the current drive capability of the differential amplifier according to the adjustment signal. In this case, in the adjustment unit, the adjustment of the voltage value of the adjustment signal is started when the potential difference between the differential signals exceeds a set value.

PRIOR ART DOCUMENT

Patent Document

Patent Document 1: Japanese patent publication No. JP2011-035845B2

SUMMARY OF THE INVENTION

Problem to be Solved by the Invention

However, the current-switching technology up to now requires the placement of an additional current source to change the bias current and a transistor to play the role of a switch. This results in such a problem that the circuit area increases in order to achieve both of low current consumption and high-speed operation.

In addition, in order to seamlessly increase the bias current according to the load as in the technology for LDO (Low Drop-Out) regulators, it is necessary to monitor the inductor current in the case of a DC to DC converters. Therefore, we have such problems that a dedicated circuit is required, and the circuit area is still large.

The purpose of the present invention is to solve the above problems and to achieve both of low current consumption and high-speed operation without increasing the circuit area, for example, in a differential amplifier circuit used in an error amplifier or comparator that is a component of a DC to DC converter.

Means for Dissolving the Problem

According to one aspect of the present invention, there is provided a differential amplifier circuit including a differential input circuit. The differential input circuit includes first and second transistors, and the differential amplifier circuit amplifies and outputting a difference voltage between a first input voltage applied to a control terminal of the first transistor and a second input voltage applied to a control terminal of the second transistor. The differential input circuit includes a P-channel depletion type transistor having a gate connected to the control terminal of the first transistor and a source connected to the control terminal of the second transistor. The P-channel deletion type transistor operates as a bias current source of the differential amplifier circuit.

Effects of the Invention

Accordingly, according to the differential amplifier circuit of the present invention, the differential input circuit includes the P-channel depletion type transistor having the gate connected to the control terminal of the first transistor and the source connected to the control terminal of the second transistor, and the P-channel depletion type transistor operates as a bias current source of the differential amplifier circuit. Hence, for example, in the differential amplifier circuit used in an error amplifier or a comparator that is a component of a DC to DC converter, both of low current consumption and high-speed operation can be achieved without increasing the circuit area.

BEST MODE FOR CARRYING OUT THE INVENTION

In the following, embodiments and variations of the present invention will be described with reference to the drawings. The same numerical differences are attached to the same or similar components.

Findings of the Inventor

The embodiments of the present invention have the following features in error amplifiers or comparators used in DC to DC converters that require low current consumption and high-speed operation. In this embodiment, a P-channel depletion type transistor with a threshold near 0 V is employed as a bias current source, and the two input terminals of the differential input stage are connected to the gate and source of the P-channel depletion type transistor, respectively. The two input terminals of the differential input stage are connected to the gate and source of the P-channel depletion type transistor, and the current corresponding to the potential difference between the two input terminals is automatically and seamlessly supplied to the circuit by the P-channel depletion type transistor.

The following is a detailed description of the embodiment and variations of the embodiment with reference to the drawings.

Embodiment 1

Figure 1:
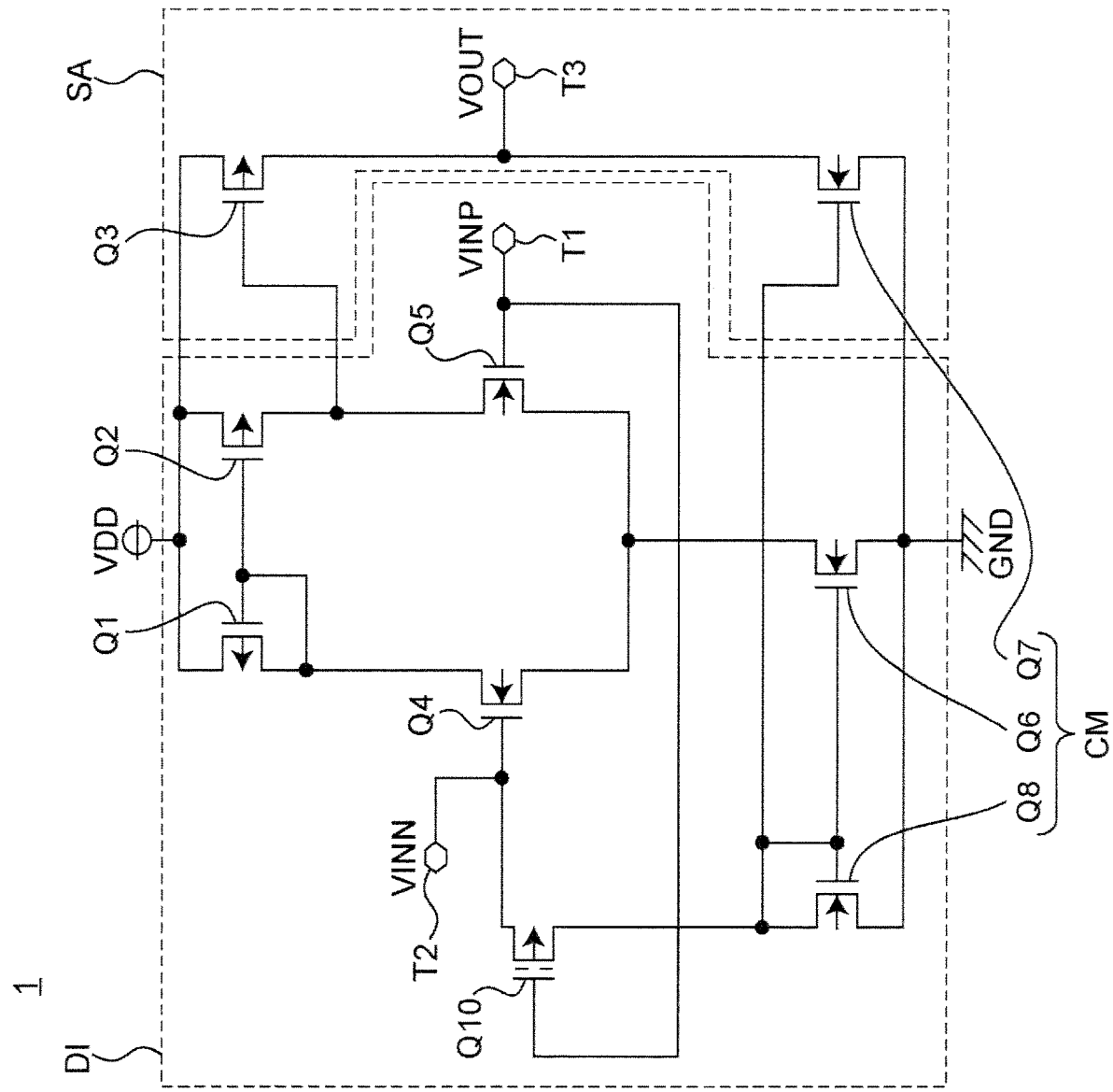
FIG. 1 is a circuit diagram showing an example of configuration of a differential amplifier circuit 1 according to Embodiment 1.

FIG. 1 is a circuit diagram showing an example of configuration of a differential amplifier circuit 1 according to Embodiment 1. Referring to FIG. 1, the differential amplifier circuit 1 is configured to include a differential input circuit DI and a source-grounded amplifier circuit SA. In this case, the differential input circuit DI is configured to include: a current mirror load circuit including P-channel MOS (Metal-Oxide Semiconductor) field-effect transistors (hereinafter each referred to as PMOS transistor or MOS transistor) Q1 and Q2; a non-inverting input terminal T1; an inverting input terminal T2; N-channel MOS field-effect transistors (hereinafter each referred to as NMOS transistors or MOS transistors) Q4 and Q5 that configure a differential pair; a P-channel depletion-type MOS field-effect transistor (hereinafter referred to as a depletion-type PMOS transistor or MOS transistor) Q10; and a bias current source circuit including NMOS transistors Q6 and Q8. The source-grounded amplifier circuit SA is configured to include a PMOS transistor Q3, an NMOS transistor Q7, and an output terminal T3. In this case, the three NMOS transistors Q6, Q7, and Q8 configure a current mirror circuit CM, which operates as bias current sources for the differential amplifier circuit 1 and the source-grounded amplifier circuit SA.

Referring to FIG. 1, the power supply voltage VDD is grounded through the source and drain of the MOS transistor Q1, the drain and source of the MOS transistor Q4, the drain and source of the MOS transistor Q6, and further, the power supply voltage VDD is grounded through the source and drain of the MOS transistor Q2, the drain and source of the MOS transistor Q5, and the drain and source of the MOS transistor Q6. In addition, the power supply voltage VDD is grounded through the source and drain of the MOS transistor Q3 and the drain and source of the MOS transistor Q7. The gate of the MOS transistor Q1 and the gate of the MOS transistor Q2 are connected to each other and to the drain of the MOS transistor Q1. The drain of the MOS transistor Q2 is connected to the gate of the MOS transistor Q3.

In the differential input circuit DI, the non-inverting input terminal T1 to which the input voltage VINP is applied is connected to the gate (control terminal) of the MOS transistor Q5 and to the gate (control terminal) of the MOS transistor Q10. In addition, the inverting input terminal T2 to which the input voltage VINN is applied is connected to the gate of the MOS transistor Q4 and the source of the MOS transistor Q10.

In the current mirror circuit CM, the drain of the MOS transistor Q10 is connected to the drain of the MOS transistor Q8 and to the respective gates of the MOS transistors Q6, Q7, and Q8. The sources of the MOS transistors Q6, Q7, and Q8 are grounded. In this case, the MOS transistors Q6, Q7, and Q8 configure a current mirror circuit, and each of the drain-to-source currents of the MOS transistors Q6 and Q7 flows correspondingly in proportion to the bias current, which is the drain-to-source current flowing in the MOS transistor Q8.

The differential amplifier circuit 1 configured as described above subtracts the input voltage VINN inputted to the inverting input terminal T2 from the input voltage VINP inputted to the non-inverting input terminal T1, and outputs the amplified voltage of the difference voltage of the subtraction result as the output voltage VOUT from the output terminal T3.

The differential amplifier circuit 1 of this embodiment is characterized by the use of the depletion type PMOS transistor Q10 as the bias current source of the differential amplifier circuit 1, in the two-stage configuration of the differential input circuit DI and the source-grounded amplifier circuit SA, which are components of a general error amplifier. In order to achieve both of low current consumption and high speed operation, the threshold voltage of the depletion type PMOS transistor Q10 is preferably set to be close to 0V.

For example, in the case of a VFM control comparator of a DC to DC converter, the output voltage and the reference voltage are often connected to the input terminals T1 and T2, respectively. When the output voltage is higher than the reference voltage, that is, the gate voltage of the depletion type PMOS transistor Q10 is higher than the source voltage, the depletion type PMOS transistor Q10 is turned off, and then, the bias current supplied to the differential amplifier circuit 1 is limited. When the output voltage is below the reference voltage, that is, the gate voltage of the depletion-type PMOS transistor Q10 is lower than the source voltage, the depletion-type PMOS transistor Q10 is turned on, and then, the bias current supplied to the differential amplifier circuit 1 is increased. If the output voltage is below the reference voltage and the difference is large, the gate-to-source voltage Vgs between the gate and the source of the depletion-type PMOS transistor Q10 will widen, and the bias current supplied to the differential amplifier circuit 1 will increase.

Figure 2:
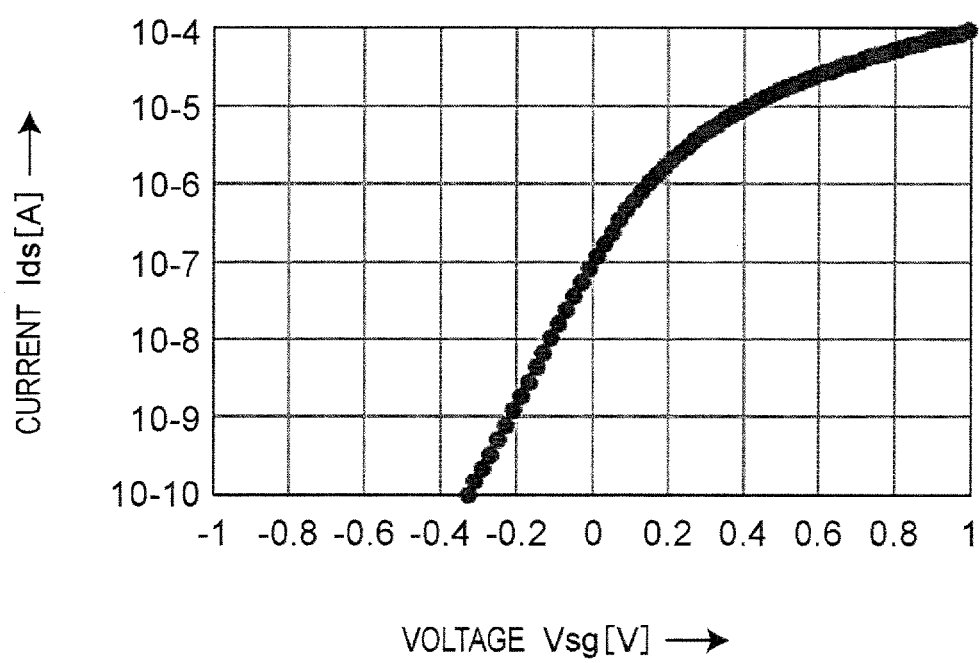
FIG. 2 is a graph showing an example of drain-to-source current Ids characteristics against a source-gate voltage Vgs of a P-channel depletion-type MOS transistor Q10 of FIG. 1.

FIG. 2 is a graph showing an example of drain-to-source current Ids characteristics against the source-gate voltage Vgs of the depletion-type PMOS transistor Q10 of FIG. 1 (hereinafter referred to as current-voltage characteristics).

As can be seen from FIG. 2, when the source-to-gate voltage Vgs is −0.2 V, the drain-to-source current Ids generated from the current-voltage characteristics of FIG. 2 is 1 nA. In addition, when the source-to-gate voltage Vgs is 0.2 V, the drain-to-source current Ids generated is 1 μA. In other words, the current generated depending on the relationship between the gate voltage and the source voltage of the depletion type PMOS transistor Q10 differs by an order of magnitude (changes remarkably).

As explained above, this embodiment employs the depletion-type PMOS transistor Q10 with a threshold value near 0 V as the bias current source for the differential amplifier circuit 1 used in the DC to DC converter that requires low current consumption and high-speed operation. The two input terminals T1 and T2 of the differential input circuit DI are connected to the gate and source of the depletion type PMOS transistor Q10, respectively. As a result, the current corresponding to the potential difference between the two input terminals T1 and T2 is automatically and seamlessly supplied to the differential amplifier circuit 1 by the depletion-type PMOS transistor Q10. This makes it possible to achieve both of low current consumption and high-speed operation in the differential amplifier circuit 1 without increasing the circuit area.

Differences from Patent Document 1

Patent Document 1 discloses that the bias current source of the differential input stage is made small when the voltage difference of the differential signal to be inputted is small, and is made large when the voltage difference of the differential signal to be inputted is large, for the purpose of achieving both of low current consumption and high-speed operation. There is indeed a similarity with this implementation in terms of achieving both of low current consumption and high-speed operation. However, as mentioned above, the problem of a large circuit area has not been solved.

In contrast, in this embodiment, the depletion-type PMOS transistor Q10 with a threshold near 0V is employed as the bias current source of the differential amplifier circuit 1, and the two input terminals T1 and T2 of the differential input circuit DI are connected to the gate and source of the depletion-type PMOS transistor Q10, respectively. As a result, the current corresponding to the potential difference between the two input terminals T1 and T2 is automatically and seamlessly supplied to the differential amplifier circuit 1 by the depletion-type PMOS transistor Q10. Therefore, both of low current consumption and high-speed operation can be achieved in the differential amplifier circuit 1, which is a component of the DC to DC converter, without increasing the circuit area.

Embodiment 2

Figure 3:
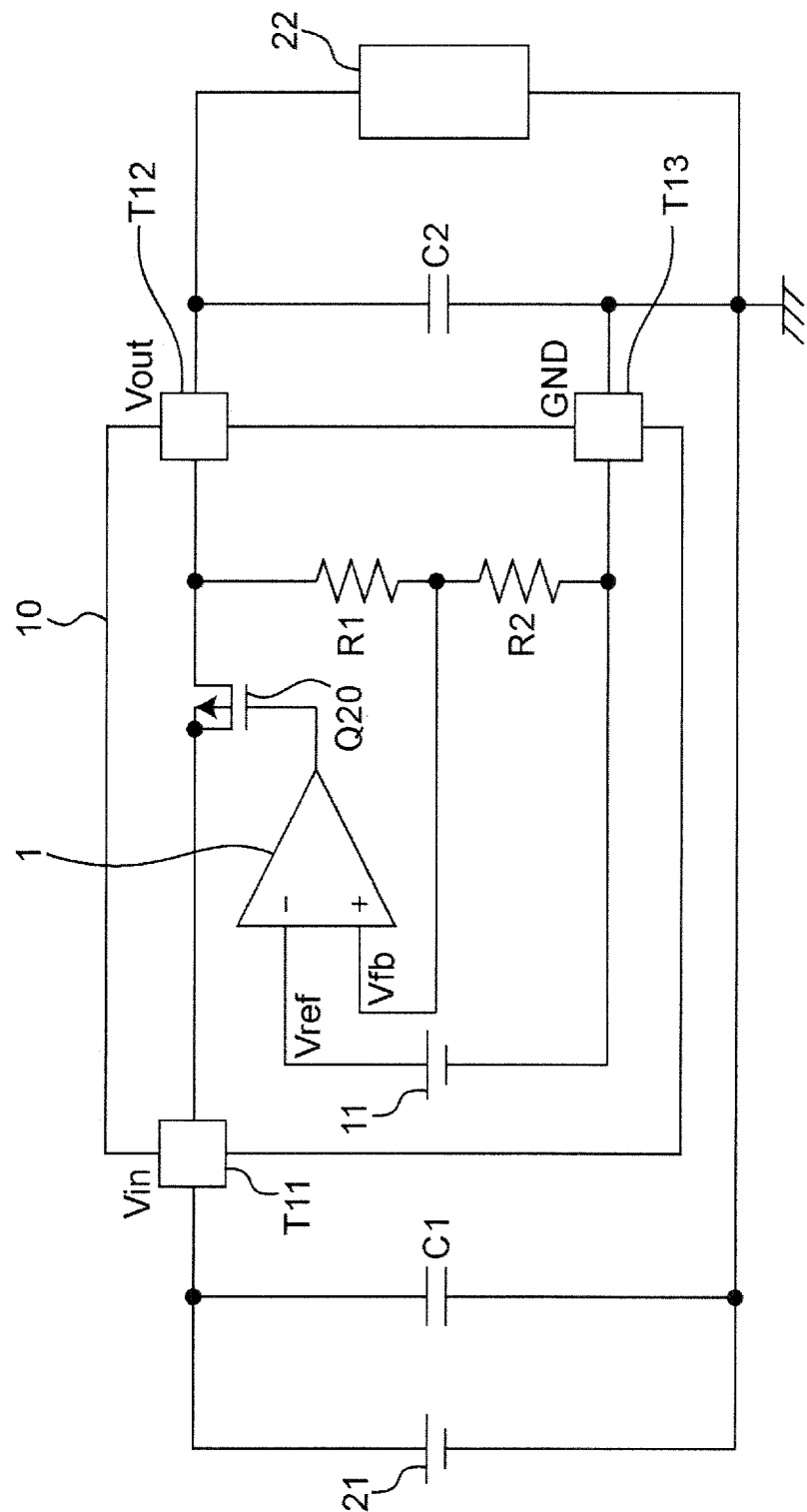
FIG. 3 is a circuit diagram showing an example of configuration of a linear regulator 10 according to Embodiment 2, using the differential amplifier circuit 1.

FIG. 3 is a circuit diagram showing an example of configuration of a three-terminal linear regulator 10 according to Embodiment 2, using the differential amplifier circuit 1. The linear regulator 10 is an example of a regulator or a DC to DC converter. The regulator or DC to DC converter is also an example of a power converter apparatus.

Referring to FIG. 3, the linear regulator 10 is configured to include an input terminal T11, an output terminal T12, a ground terminal T13, a reference voltage source 11, a differential amplifier circuit 1, an output driver transistor Q20, and voltage divider resistors R1 and R2. The output voltage Vout of the output terminal T12 of the linear regulator 10 is divided by the voltage dividing resistors R1 and R2, and the divided voltage is applied to the non-inverting input terminal of the differential amplifier circuit 1 as the feedback voltage Vfb. The reference voltage Vref from the reference voltage source 11 is applied to the inverting input terminal of the differential amplifier circuit 1. The differential amplifier circuit 1 amplifies the difference voltage (Vfb−Vref) between the non-inverting input terminal and the inverting input terminal thereof, and applies the amplified difference voltage to the gate of the output driver transistor Q20 as a gate control voltage. This controls the current flowing in the output driver transistor Q20, thereby controlling the output voltage Vout.

In the linear regulator 10 configured as described above, the input voltage Vin from the input voltage source 21 is applied to the input terminal T11 of the linear regulator 10 through the input capacitor C1. The linear regulator 10 controls the output voltage Vout to be a predetermined output voltage Vout, and the controlled output voltage Vout is outputted to the load 22 through the output capacitor C2.

In the linear regulator 10 of FIG. 3, since the differential amplifier circuit 1 of FIG. 1 is used as the error amplifier, as described above, both of low current consumption and high-speed operation can be realized in the differential amplifier circuit 1, which is a component of the DC to DC converter, without increasing the circuit area.

Modified Embodiments

In the above embodiments, the P-channel depletion type MOS transistor Q10 is used, however, the present invention is not limited thereto, and various kinds of P-channel depletion type transistors may be used.

In the above embodiments, the MOS transistors Q1 to Q8 are used to configure the differential amplifier circuit 1, however, the invention is not limited to this, and a differential amplifier circuit may be configured by using transistors such as bipolar transistors.

INDUSTRIAL APPLICABILITY

As described in detail above, according to the differential amplifier circuit of the present invention, the differential input circuit includes the P-channel depletion type transistor having the gate connected to the control terminal of the first transistor and the drain connected to the control terminal of the second transistor, and the P-channel depletion type transistor operates as the bias current source of the differential amplifier circuit. Therefore, in the differential amplifier circuit used in the error amplifier or the comparator, which is a component of a DC to DC converter, for example, both of low current consumption and high-speed operation can be achieved without increasing the circuit area. In the case of the differential amplifier circuit used in an error amplifier or comparator, both of low current consumption and high-speed operation can be achieved without increasing the circuit area.

The invention claimed is:

1. A differential amplifier circuit comprising a differential input circuit including first and second transistors, the differential amplifier circuit amplifying and outputting a difference voltage between a first input voltage applied to a control terminal of the first transistor and a second input voltage applied to a control terminal of the second transistor,
   wherein the differential input circuit includes a P-channel depletion type transistor having a gate connected to the control terminal of the first transistor and a source connected to the control terminal of the second transistor, and
   wherein the P-channel deletion type transistor operates as a bias current source of the differential amplifier circuit.

2. The differential amplifier circuit as claimed in claim 1, wherein the first and second transistors are MOS field-effect transistors, respectively, and
   wherein the P-channel depletion-type transistor is a P-channel depletion-type MOS field-effect transistor.

3. A power converter apparatus including a differential amplifier circuit,
   wherein the differential amplifier circuit comprises a differential input circuit including first and second transistors, the differential amplifier circuit amplifying and outputting a difference voltage between a first input voltage applied to a control terminal of the first transistor and a second input voltage applied to a control terminal of the second transistor,
   wherein the differential input circuit includes a P-channel depletion type transistor having a gate connected to the control terminal of the first transistor and a source connected to the control terminal of the second transistor, and
   wherein the P-channel deletion type transistor operates as a bias current source of the differential amplifier circuit.

4. The power converter apparatus as claimed in claim 3, wherein the power converter apparatus is a regulator.

5. The power converter apparatus as claimed in claim 3, wherein the power converter apparatus is a DC to DC converter.

* * * * *